United States Patent
Perniola et al.

(10) Patent No.: US 9,431,608 B2
(45) Date of Patent: Aug. 30, 2016

(54) HYBRID NON-VOLATILE MEMORY DEVICE AND METHOD FOR MANUFACTURING SUCH A DEVICE

(71) Applicant: COMMISSARIAT A L'ENERGIE ATOMIQUE ET AUX ENERGIES ALTERNATIVES, Paris (FR)

(72) Inventors: Luca Perniola, Noyarey (FR); Bernard Dieny, Lans en Vercors (FR)

(73) Assignee: COMMISSARIAT À L'ÉNERGIE ATOMIQUE ET AUX ÉNERGIES ALTERNATIVES, Paris (FR)

(*) Notice: Subject to any disclaimer, the term of this patent is extended or adjusted under 35 U.S.C. 154(b) by 0 days.

(21) Appl. No.: 14/887,687

(22) Filed: Oct. 20, 2015

(65) Prior Publication Data

US 2016/0111642 A1 Apr. 21, 2016

(30) Foreign Application Priority Data

Oct. 20, 2014 (FR) .................................... 14 60078

(51) Int. Cl.
  *H01L 45/00* (2006.01)
(52) U.S. Cl.
  CPC ......... *H01L 45/146* (2013.01); *H01L 45/1233* (2013.01); *H01L 45/1616* (2013.01); *H01L 45/1625* (2013.01); *H01L 45/1675* (2013.01)
(58) Field of Classification Search
  CPC ............. H01L 45/146; H01L 45/1616; H01L 45/1625; H01L 45/1233; H01L 45/1675
  See application file for complete search history.

(56) References Cited

U.S. PATENT DOCUMENTS

| 7,038,261 B2 * | 5/2006 | Horii ..................... H01L 29/685 257/295 |
| 2003/0209746 A1 * | 11/2003 | Horii ..................... H01L 29/685 257/295 |
| 2007/0103964 A1 | 5/2007 | Kim et al. |
| 2012/0032136 A1 * | 2/2012 | Redaelli ............. H01L 27/2445 257/5 |

(Continued)

FOREIGN PATENT DOCUMENTS

FR  2 972 286 A1  9/2012

OTHER PUBLICATIONS

Lee, S., et al., "Selector-less ReRAM with an Excellent Non-Linearity and Reliability by the Band-gap Engineered Multi-Layer Titanium Oxide and Triangular Shaped AC Pulse," Electron Devices Meeting (IEDM), 2013, pp. 10.6.1-10.6.4.

*Primary Examiner* — Nikolay Yushin
(74) *Attorney, Agent, or Firm* — Pillsbury Winthrop Shaw Pittman LLP

(57) ABSTRACT

A method for manufacturing a hybrid non-volatile memory device includes forming first conductive pads; depositing a first conductive layer on a second area of the substrate; etching the first conductive layer to obtain second conductive pads, the second conductive pads having a section at their base smaller than at their top; protecting the upper face of the second conductive pads; oxidizing the substrate so that an insulating material layer covers the upper face of the first conductive pads and sides of the second conductive pads; depositing an oxide layer at the tops of the first conductive pads, resulting in memory elements of a first type supported by the first conductive pads; and forming memory elements of a second type at the tops of the second conductive pads. Each memory element of the second type is supported by one of the second conductive pads.

15 Claims, 7 Drawing Sheets

(56) References Cited

U.S. PATENT DOCUMENTS

2012/0236626 A1\* 9/2012 Gaillardon .......... H01L 27/2445 365/148

2012/0307552 A1\* 12/2012 Perniola .............. H01L 45/1625 365/163

2014/0158967 A1 6/2014 Hou et al.

\* cited by examiner

HYBRID NON-VOLATILE MEMORY DEVICE AND METHOD FOR MANUFACTURING SUCH A DEVICE

CROSS-REFERENCE TO RELATED APPLICATIONS

This application claims priority to French Patent Application No. 1460078, filed Oct. 20, 2014, the entire content of which is incorporated herein by reference in its entirety.

FIELD

The present invention relates to the field of non-volatile memories with resistive elements, and more particularly to a memory device incorporating memory elements of OxRAM (Oxide Resistive Random Access Memory) type.

BACKGROUND

Several non-volatile memory technologies are currently being developed with various degrees of maturity. PCRAM (Phase Change RAM), CBRAM (Conductive Bridge RAM) or OxRAM (Oxide based RAM), FeRAM (Ferroelectric RAM) and MRAM (Magnetic RAM) may especially be cited. Apart from FeRAM memories which operate according to the principle of the orientation of an electric dipolar moment in a ferroelectric material, all the other memories use materials of variable electrical resistance. Each information bit is stored in a memory point including a variable resistance element. The information bit is encoded by the resistance value of this storage element. Typically, the logical level '0' corresponds to a high resistance value and the logical level '1' corresponds to a low resistance value.

The mechanism behind the variation in resistance depends on the technology used. In PCRAM for example, chalcogenide semi-conductor materials are used which can be made to transit from an amorphous state to a crystalline state (or vice-versa), by current pulses of suitable amplitude and duration. In MRAM, the storage element is a magnetic tunnel junction having a tunnel magnetoresistance effect. In CBRAM, conductive filaments are formed or destroyed by making metal ions (for example $Ag^+$) diffuse in a semi-conducting array (for example Ge). Finally, OxRAM have a behaviour similar to that of CBRAM in the sense where a conductive filament is formed in an oxide. This filament is formed by accumulation of oxygen vacancies (at least for the family of transition metal based oxides), rather than by accumulation of metal ions. All these memory forms involve the passage of a current through the storage element, which has an electrical resistance varying between a minimum value and a maximum value.

Each of these non-volatile memory technologies has advantages and drawbacks. For example, MRAM are rapid and withstand a virtually unlimited number of reading/writing cycles but have a lower integration density than resistive memories of OxRAM and CBRAM type. OxRAM and CBRAM benefit from low consumption and high integration density, but the variability of the performances between memory points is considerable. These two types of memory moreover have the advantage of being able to be integrated above a logic circuit, for example a microprocessor ("BEOL" integration).

In order to benefit fully from these different advantages, it is customary to combine several memory technologies. Around the microprocessor, it is especially possible to provide MRAM (high speed and endurance) to replace the current SRAM (Static Random Access Memory) of "cache" levels (levels L1 to L3), and PCRAM as the main memory instead of DRAM (Dynamic Random Access Memory). Further away from the microprocessor, OxRAM and CBRAM memories (high integration density and low consumption) advantageously replace the "Flash" memory as mass storage memories.

At the present time, these different non-volatile memories are formed by as many electronic components connected on a same printed circuit (for example a motherboard). However, the integration of two (or more) types of memory within a same component, that is to say on a same semi-conductor substrate, would enable more efficient processing of information by the microprocessor. Indeed, the flow of information would be increased, due to the memories being brought closer together. The co-integration of several types of memory would also facilitate the replacement of volatile memories (SRAM, DRAM) by non-volatile memories and would improve the distribution of the memories around the microprocessor. There thus exists today a need to provide a memory device combining several emerging non-volatile memory technologies on a same substrate in order to benefit simultaneously from the advantages linked to each of these technologies.

Among OxRAM memories, it is possible to distinguish those having a selection device (typically a transistor), which makes it possible during the reading of a memory point to limit leakage currents to adjacent memory points, and those exempt of such a selection device. The latter are qualified as "selector-less". The article ["Selector-less ReRAM with an excellent non-linearity and reliability by the band-gap engineered multi-layer titanium oxide and triangular shaped AC pulse"; Lee S. et al., Electron Devices Meeting (IEDM), pp. 10.6.1-10.6.4, 2013] describes an example of selector-less OxRAM resistive memory.

Selector-less OxRAM have a more compact structure (by virtue of the absence of selection transistor). The problem of leakage currents therein is resolved by connecting a diode in series with the active layer formed by a metal oxide (e.g. $HfO_2$, $Ta_2O_5$). This diode fulfills the function of selector, because the memory then has a non-linear current-voltage characteristic provided with a threshold voltage.

Patent application US2014/0158967 gives another example of selector-less (also called "auto-selective") OxRAM resistive memory formed by depositing a first layer of metal (for example titanium) on a substrate, by oxidising the first layer of metal in order to form a first oxide layer ($TiO_2$), then by depositing a second oxide layer (e.g. $Ta_2O_5$) and a second layer of metal (e.g. Ta). The first and second metal layers form respectively the bottom and top electrodes. The first oxide layer forms a Schottky diode with the bottom electrode and the second oxide layer in (ohmic) contact with the top electrode constitutes the active layer, where the conductive filaments are formed.

To delimit the different memory points, this stack of layers is generally etched, typically by reactive plasma etching. Yet, for dimensions of memory points less than 30 nm, this etching can cause damage to the active material, i.e. the bistable resistance oxide ($Ta_2O_5$ in the above example). Moreover, the reactive etching plasma may be the source of numerous structural and/or chemical defects at the edges of the memory points.

SUMMARY

An aspect of the invention aims to integrate in the same memory device several types of memory elements (or storage elements) of variable electrical resistance on a same substrate, among which selector-less OxRAM type elements, while limiting damaging and defects of the memory elements.

This aspect tends to be met by providing a method of manufacturing a hybrid non-volatile memory device including the following steps:

forming a first group of electrically conductive pads spaced apart from each other in a first area of a substrate;

depositing a first electrically conductive layer on a second area of the substrate;

etching the first conductive layer, so as to obtain a second group of electrically conductive pads spaced apart from each other in the second area, the etching conditions being chosen such that the conductive pads of the second area have a section at their base smaller than at their top;

protecting the upper face of the conductive pads of the second area;

subjecting the substrate to an oxidation treatment, resulting in a layer made of insulating material covering the upper face of the conductive pads of the first area and the sides of the conductive pads of the second area;

depositing an oxide layer at the tops of the conductive pads of the first area, resulting in memory elements of a first type supported by the conductive pads of the first area; and forming by physical vapor deposition memory elements of a second type at the tops of the conductive pads of the second area, such that each memory element of the second type is supported by one of the conductive pads of the second area.

The first area of the substrate is dedicated to memory elements of selector-less or auto-selector OxRAM type. The oxide layer deposited at the tops of the conductive pads of the first area forms the active layer of these memory elements. It may be continuous from one memory element to the next, because it is electrically insulating. It thus does not need to be etched to avoid a short-circuit between the memory elements. The OxRAM memory elements are differentiated by the underlying conductive pads, which form bottom electrodes.

The second area of the substrate is devoted to the formation of elements of another type than those of the first area, for example MRAM or PCRAM. In the second area, the conductive pads have overhanging (or "turning inward") sides, such that when the resistive material of the MRAM or PCRAM memory elements are deposited, the layer of this resistive material is discretised at the tops of the pads and between the pads. In other words, the flared pads or pillars of the second area make it possible to structure naturally the MRAM or PCRAM memory elements, without there being need for the resistive material to be etched a posteriori. "Resistive material" refers to the material(s) that constitute the variable resistance memory element. It may be a conductive material playing the role of electrode (for example the magnetic reference layer in a MRAM) or the active material, that is to say that which fulfills the storage function (for example the phase change layer in a PCRAM memory).

Thus, an etching of the resistive material is avoided, not only in the first area for the formation of OxRAM memory elements but also in the second area for the formation of MRAM or PCRAM memory elements. Since the step of etching the resistive material by reactive plasma etching is avoided, the memory elements contain fewer structural and/or chemical defects on the edges. Consequently, in each of the areas of the substrate, the hybrid memory device according to an embodiment of the invention has less variability from one memory point to the next in terms of performances. Moreover, the MRAM or PCRAM memory elements do not risk being corroded as is generally the case with an etching by reactive plasma.

The conductive pads are electrically insulated from each other in the first area, because the oxide layer that connects them, generally a transition metal oxide (e.g. $HfO_2$, $Ta_2O_5$), is electrically insulating. In the second area, the conductive pads are also insulated from each other, despite the presence of conductive resistive material (for example magnetic or phase change) at the bottom of the trenches separating the flared pads, thanks to the fact that this material does not cover the sides at the base of the pads. Indeed, the deposition of the resistive material of the MRAM or PCRAM elements being carried out according to a substantially directive method, by physical vapor deposition (PVD) such as cathodic sputtering or evaporation, the overhanging upper part of each pad prevents by shading effect the deposition of the material at the base of the sides.

Moreover, the electrical insulation between the flared conductive pads of the second area is reinforced by the presence of the layer of insulating material on their sides. This insulating layer is formed simultaneously on the upper face of the pads of the first area, by subjecting all of the pads of the substrate to oxidation treatment. At the tops of the conductive pads of the first area, the insulating layer fulfills the function of current rectifier, according to the principle of a diode. A behaviour similar to that of OxRAM memories with selection device may then be obtained, because the current-voltage characteristic of these memory points is non-linear and has a threshold voltage. Depending on the materials forming the conductive pads of the first and second areas, the material that constitutes the insulating layer on the upper face of the pads of the first area may be different to that which constitutes the insulating layer on the sides of the pads of the second area.

Since the upper face of the pads of the second area is protected during the oxidation treatment, the insulating layer does not form thereon. Electrical continuity between each conductive pad and the corresponding memory element is thereby assured.

The conductive pads of the first area do not necessarily have overhanging sides, like those of the second area. In fact, since it is unnecessary to "cut" the metal oxide layer, they can have vertical or tilted sides, with a section at their base larger than at their top ("outward" sides).

In an embodiment of the manufacturing method, the pads of the first area of the substrate are formed of pillars identical to those of the second area. They are formed at the same time as the conductive pads of the second area, by etching the first conductive layer deposited beforehand on the first and second areas. The etching conditions are thus chosen such that the conductive pads of the first area also have a section at their base smaller than at their top.

In an embodiment, the method further comprises a step of depositing a second conductive layer, for example made of titanium, on the first conductive layer in the first area, the first and second conductive layers being etched simultaneously to form the conductive pads of the first area.

When the memory elements of the second type (e.g. MRAM or PCRAM) are formed simultaneously by physical vapor deposition at the tops of the conductive pads of the first area and at the tops of the conductive pads of the second area, the method further comprises, before the step of depositing the oxide layer, the following steps:

covering the conductive pads of the first and second areas with a dielectric material;

etching the dielectric material in the first area until the memory elements of the first area are revealed; and eliminating the memory elements of the first area.

The oxide layer is beneficially deposited on the first and second areas by PECVD or ALD.

In an alternative embodiment, the conductive pads of the first area are formed before the deposition of the first conductive layer on the second area, their shape being able to be different to that of the pads of the second area.

The method according to an embodiment of the invention may also have one or more of the characteristics below, considered individually or according to any technically possible combinations thereof:

the upper face of the conductive pads of the second area is protected by forming in the second area a protective layer on the first conductive layer, before the step of etching of the first conductive layer;

the protective layer, for example made of ruthenium, occupies the entire second area and is etched at the same time as the first conductive layer to form the conductive pads of the second area;

the protective layer is constituted of an etching mask serving to etch the first conductive layer, this mask being removed after the oxidation treatment;

the first conductive layer is etched by reactive plasma etching.

Another aspect of the invention relates to a hybrid non-volatile memory device comprising:

a substrate comprising first and second areas;

a plurality of electrically conductive pads arranged on the substrate and spread out between the first and second areas, the pads of the second area having a section at their base smaller than at their top;

an electrically insulating layer covering the sides of the conductive pads of the second area and at least the upper face of the conductive pads of the first area;

a first storage layer made of oxide covering the conductive pads of the first area, resulting in a plurality of memory elements of a first type in the first area; and a plurality of memory elements of a second type arranged at the tops of the conductive pads of the second area, such that each memory element is supported by one of the conductive pads of the second area, the memory elements of the second type comprising a second electrically conductive storage layer.

BRIEF DESCRIPTION OF THE FIGURES

Other characteristics and benefits of the invention will become clearer from the description that is given thereof below, as an indication and in no way limiting, with reference to the appended figures, among which.

For greater clarity, identical or similar elements are marked by identical reference signs in all of the figures.

DETAILED DESCRIPTION

Figure 1:
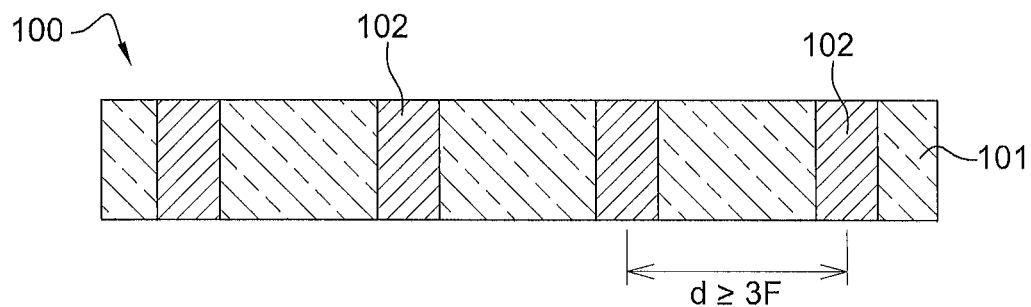
FIG. 1 schematically represents a substrate on which may be manufactured a hybrid memory device according to an embodiment of the invention.

An embodiment of a method for manufacturing a hybrid memory device is described below with reference to FIGS. 1, 2A to 2J. FIG. 1 shows a substrate 100 which serves as starting point for the manufacturing method, whereas FIGS. 2A to 2J represent the steps F1 to F10 of the manufacturing method.

This method aims to integrate on the substrate 100 a group of memory points of selector-less OxRAM type and a group of non-volatile memory points of another technology, for example MRAM or PCRAM. These two groups of memory points are, in an embodiment, organised into arrays. In other words, the memory points are arranged in lines and columns on the surface of the substrate 100. Each memory point includes a memory element, or storage element, of variable electrical resistance.

The substrate 100, in an embodiment, comprises a CMOS circuit capable of addressing each memory point of the hybrid memory device and read the data recorded in the memory element, i.e. the electrical resistance value of this element. This circuit comprises for example transistors electrically connected to the memory elements by one or more interconnection levels. In FIG. 1 is represented in cross section uniquely the final interconnection level before the memory points. It is formed of a layer made of dielectric material 101 (for example $SiO_2$ or $Al_2O_3$) traversed by interconnection patterns 102, such as conductive vias or conductive lines, typically made of metal (copper, aluminium, etc.). These interconnection patterns 102 allow to electrically connect the memory elements to the CMOS circuit.

For non-volatile memory applications, it is generally sought to integrate the storage elements as high as possible in the stack, in order to optimise the manufacturing process. In an embodiment, the conductive pillars of the hybrid memory device are formed above one of the final metal layers.

The conductive vias (or conductive lines) 102 are (in current technologies) typically separated by a distance d greater than or equal to 3F, where F designates the resolution of the memory device, that is to say the minimum dimension that can be attained by lithography ("half-pitch"). This value of 3F corresponds for example in CMOS technology to the distance separating two consecutive emerging vias of MOS-FET transistors.

Naturally, like any metal level of the substrate, the interconnection level of FIG. 1 may comprise other patterns (via or line type) than those intended to electrically connect the memory elements (and referenced 102). For example, these other patterns can connect a lower level to an upper level to that of memory elements or two MOS transistors situated lower down in the substrate. In the case of lines, they are moreover not necessarily through lines.

Steps F1 to F10 described below in relation with FIGS. 2A to 2J allow to form, on this starting substrate 100, vertical nanostructures connected in series with the conductive vias 102 and insulated from each other. Among these vertical nanostructures, may be distinguished memory points of selector-less OxRAM type and memory points of MRAM or PCRAM type. Thus, a first area 100a of the substrate 100 is dedicated to the formation of memory points of selector-less OxRAM type and a second area 100b is intended for the formation of memory points of MRAM or PCRAM type (FIG. 2A).

Figure 2A:
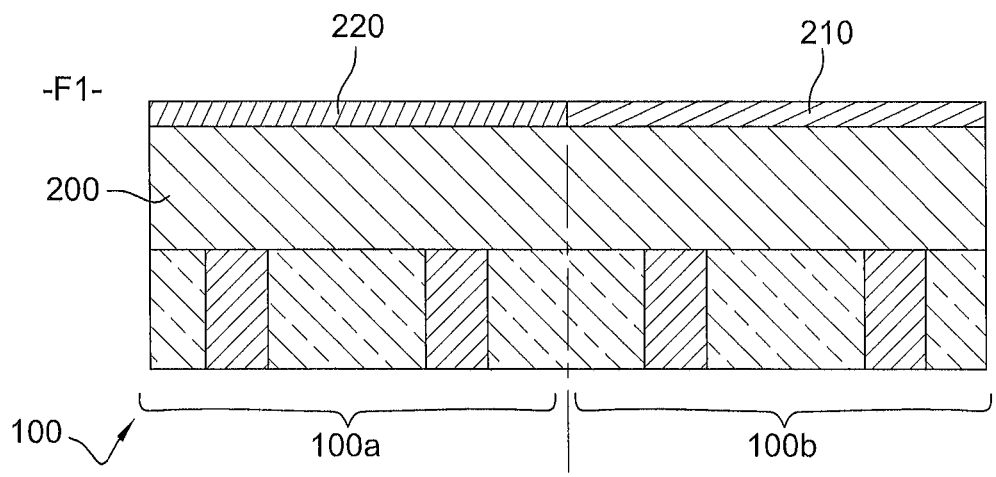
FIGS. 2A to 2J represent the steps F1 to F10 of a method for manufacturing a hybrid memory device, according to an embodiment of the invention.

Step F1 of FIG. 2A consists in depositing on the substrate 100 a first electrically conductive layer 200, for example made of tantalum. This layer 200 is intended to form conductive pads on which the memory elements will be formed. The electrical resistivity of the material of the layer 200 is such that, once etched into mesa shape, the electrical resistance of each pad is low, typically less than the maximum resistance of the memory element. In this way is minimised the parasitic series resistance effect which reduces the relative signal variation at the moment of reading the state of the memory element (Low Resistive State (LRS) or High Resistive State (HRS)). In an embodiment, the electrical resistivity of the layer 200 is less than $2.10^4$ μΩ·cm.

The material of the conductive layer 200 may be selected from tantalum (Ta), tungsten (W), aluminium (Al), titanium (Ti), titanium nitride (TiN) and highly doped polycrystalline silicon (poly-Si) (concentration of dopants for example greater than $5.10^{18}$ m$^{-3}$ for a doping with phosphorous). All of these materials meet the above resistivity condition.

In this embodiment, the conductive layer 200 occupies the first and second areas 100a-100b of the substrate 100. In the area 100b, the conductive layer 200 is beneficially covered with a protective layer 210, for example made of a material of which the oxide is conductive, such as ruthenium or chromium. The protective layer 210 may be obtained by photolithography and etching. Ruthenium is then deposited on the areas 100a and 100b of the substrate 100, covered with an etching mask, then restricted to the area 100b by etching it in the area 100a through the mask.

In the area 100a, the first conductive layer 200 is beneficially covered with a second conductive layer 220. The layer 220 is formed of a material that exhibits rectification properties once oxidised (because, according to Lee. et al., this oxide has a band gap smaller than that of the bistable oxide HfO$_2$) and of thickness beneficially comprised between 2 nm and 30 nm, in an embodiment between 5 nm and 10 nm. The material of the layer 220 is thus a material of which the oxide is electrically insulating, for example titanium. Like the protective layer 210 in the area 100b, the layer 220 may be limited to the area 100a by etching. The material of the layer 220 is deposited on the area 100a and the area 100b, the latter being covered with the layer 210, then etched until the ruthenium of the layer 210 is reached. Alternatively, the material of the layer 220 is eliminated in the area 100b by Chemical Mechanical Planarization (CMP), with stop of the planarization on the ruthenium layer 210.

In this example, the formation of the ruthenium layer 210 takes place before the formation of the conductive layer 220. Naturally, the order of these steps may be reversed, using the same structuring techniques (photolithography and etching of the conductive layer 220, then CMP or etching of the ruthenium layer 210 with stop on the layer 220).

Figure 2B:
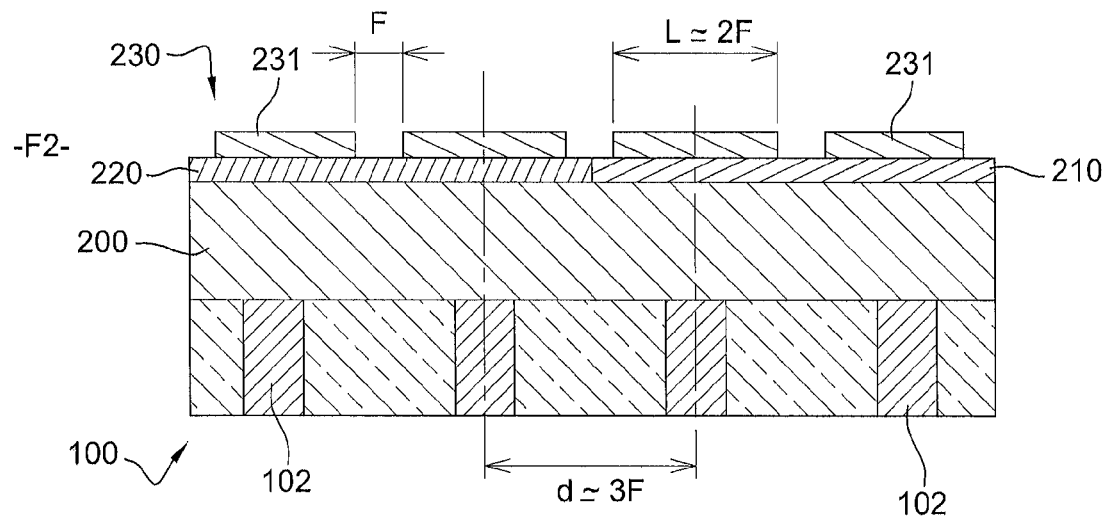

At step F2 of FIG. 2B, an etching mask 230 is formed on the layers 210 and 220. Conventionally, the etching mask 230 may be constituted of a photosensitive resin, structured by photolithography, or of a material more resistant to the etching than the photosensitive resin—in this case it is referred to as a "hard mask". The hard mask is, for example, made of silicon oxide (SiO$_2$), silicon nitride (Si$_3$N$_4$), silicon oxynitride (SiON) or amorphous carbon.

The solid parts of the mask 230 constitute patterns 231 situated directly in line with the conductive vias 102 (or conductive lines) of the substrate 100 and have the shape of the memory elements that it is wished to produce. In an embodiment, each pattern 231 is centred with respect to the underlying conductive via 102 and has dimensions greater than those of the via (such that the pad formed later covers it entirely). For example, the patterns 231 may have a width L approaching 2F (FIG. 2B). Thus, when the vias 102 are periodically spaced apart by a distance equal to 3F, the edge to edge distance of adjacent patterns 231 is of the order of F. The shape of the patterns 231 is, in an embodiment, round for reasons of homogeneity of the electrical properties over the whole periphery of the pads and to facilitate the production of the hybrid device to the most advanced technology nodes (sub-20 nm). Nevertheless, other shapes may be envisaged, especially square, elliptical or rectangular.

In F3 (FIG. 2C), the conductive layers 200, 210 and the ruthenium protective layer 220 of FIG. 2B are etched through the mask 230. The etching conditions are, in this embodiment, determined so as to obtain simultaneously in the areas 100a and 100b conductive pads or pillars 240 with overhanging sides, for example according to a notched or circular arc profile. The etching technique used during this step F3 is, in an embodiment, a reactive plasma etching. Indeed, this makes it possible (in the case of the metals of layers 200, 210 and 220) to obtain volatile etching residues which could be eliminated easily, by pumping outside of the etching reactor. A highly isotropic etching plasma should be avoided to prevent etching underneath the patterns 231 of the mask 230, which would reduce the dimensions of the upper face of the pads (and thus memory elements).

The conductive pads 240 are here mainly formed of the material of the first conductive layer 200, for example tantalum, because the layer 200 has a considerably greater thickness than that of the layers 210 and 220. The thickness of the layer 200 is, in an embodiment, comprised between 4 nm and 400 nm. The pads 240 are each constituted of a pattern 200' obtained by etching the tantalum layer 200, topped with a pattern 210' (respectively 220') stemming from the protective layer 210 (respectively the conductive layer 220) situated in the area 100b (respectively in the area 100a)

In a circular arc profile, the section of the pads 240 varies continuously, for example by increasing progressively from the base to the top of the pillars W (i.e. the upper face of the patterns 210'-220'). In a notched profile, the section of each pad 240 is firstly constant in a lower part of the pad, then increases abruptly in its upper part, near to the top. This variation in section may be continuous or instead discontinuous.

All the aforementioned materials may be etched by a reactive plasma based on fluorine (except aluminium) or chlorine (including aluminium), or even bromine. The need to produce setback sides requires an etching chemistry which can give rise to spontaneous reactions between the material and the etching gas. In an embodiment, gases containing chlorine, such as HCl, Cl$_2$ and BCl$_3$, or fluorine such as SF$_6$, NF$_3$, CF$_4$ will thus be selected. It is also possible to use mixtures of gases based on chlorine and fluorine, or mixtures of gases based on chlorine and bromine (for example, HBr is a source of bromine)

To create a circular arc or a "barrel" profile, while avoiding over-etching underneath the patterns 231 of the mask 230, the reactive etching conditions could be selected as follows:

the power of the radiofrequency electromagnetic field which generates the plasma is beneficially comprised between 150 W and 500 W, in order to limit the formation of chlorine based radicals;

the polarisation voltage applied to the substrate-holder is, in an embodiment, comprised between 15 V and 1 kV, and beneficially less than 200 V.

These parameters may be adjusted, especially during etching, to control the curvature of the arc. For example, an increase in the RF power makes it possible to increase the concentration of radicals and thus to increase the curvature. An increase in the polarisation power tends to reduce the chemical component of the etching and thus to reduce the amplitude of the barrel. The addition of a diluent gas (Ar, Xe, He, N$_2$, etc.) to reduce the concentration of chlorine in the gaseous phase, or the addition of a passivating gas, tends to make the plasma less reactive and thus to reduce the spontaneous etching reactions which create the curvature of the sides.

To create a notched profile, an etching method in two or three steps may be used. During the first step, the layers 210, 220 and the upper portion of the layer 200 (typically over 50% of its thickness) are etched anisotropically to obtain vertical sides. These vertical sides are obtained thanks to the progressive formation of a passivation layer on the walls of the etched patterns (210', 220' and a part of 200'), this passivation layer then preventing lateral etching. During this latter step, an isotropic etching is carried out to etch the remaining portion of the layer 200, vertically in the direction of the substrate 100 but also laterally. The upper part of the layer 200 is protected by the passivation layer formed previously during the first etching step. Beneficially, an intermediate oxidation step is carried out to reinforce the passivation layer.

As an example, notched pillars made of doped polysilicon may be obtained by means of etching by inductively coupled plasma based on HBr/Cl$_2$/O$_2$ (110 sccm/70 sccm/2 sccm) with an ion energy comprised between 70 eV and 80 eV, followed by an etching by a plasma based on Cl$_2$ and SF$_6$ (60 sccm/3 sccm) with an ion energy of the same order of magnitude. In the case of a conductive layer 200 made of TiN, it is possible to carry out the first etching step with an inductively coupled plasma based on HBr/Cl$_2$ (100 sccm/50 sccm), followed by an intermediate step of etching by inductively coupled plasma based on O$_2$ to oxidise the sides, and finally an etching by inductively coupled plasma based on Cl$_2$ (potentially preceded by an identical plasma with highly energetic ions (≥50 eV) to remove the titanium oxide from the etching front).

A stack of layers made of different materials, like that of layers 200 and 210 in the area 100b, or layers 200 and 220 in the area 100a, largely facilitates the formation of notched pillars. In fact, the material of the upper layer 210 or 220 may be anisotropically etched, whereas the material of the lower layer 200 is isotropically etched, without modifying the profile of the upper layer. The patterns 210' and 220' stemming respectively from the layers 210 and 220 then have straight sides whereas the patterns 200' stemming from the layer 200 have overhanging sides (cf. FIG. 2C).

For example, the titanium of a Ti/Si stack and the ruthenium of a Ru/Si stack may be etched simultaneously by an inductively coupled plasma based on oxygen and chlorine or hydrogen chloride (HCl). A dilution gas such as Ar, H$_2$, N$_2$ or He may potentially be added to the gaseous phase of the plasma. The silicon layer may then be etched using an inductively coupled plasma based on SF$_6$ or NF$_3$, potentially diluted by argon or helium.

After having obtained pillars 240 with the desired shape, the etching mask 230 is eliminated, for example by a wet process (for example in a solution of hydrofluoric acid).

Figure 2C:
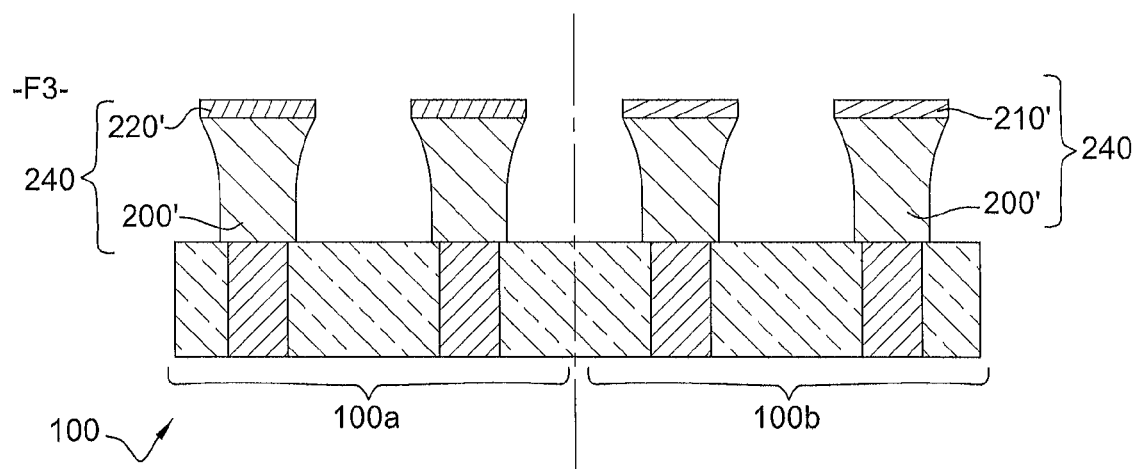
Figure 2D:
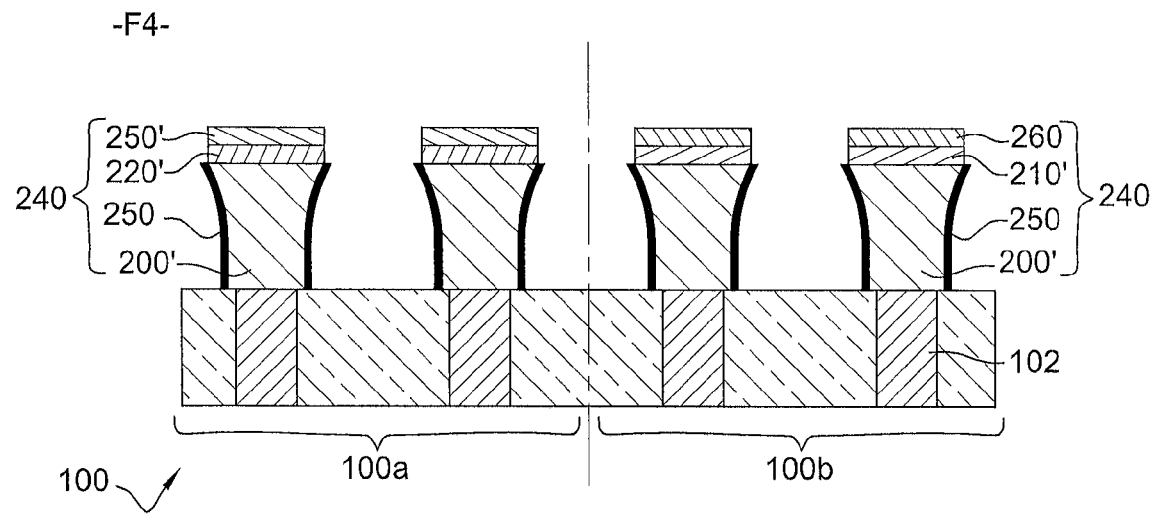

FIG. 2D represents a step F4 in which the pads 240 of the areas 100a and 100b are oxidised simultaneously. This may be obtained by subjecting the substrate 100 to a heat treatment (for example between 20° C. and 450° C.) under an oxidising atmosphere or with an oxygen based plasma. This step F4 enables to form an insulating layer on all the surfaces of the pads 240 exposed to the oxidation treatment, in particular on the sides of the conductive pads 240, which reinforces their insulation. For example, an insulating layer 250 made of tantalum oxide (Ta$_2$O$_5$) covers the sides of the conductive patterns 200' made of tantalum. Moreover, in the particular embodiment of FIG. 2D, the patterns made of ruthenium 210' and the patterns made of titanium 220' are also oxidised during step F4.

On the one hand, an insulating layer 250' made of titanium oxide (TiO$_2$) is formed on the upper face of the pads 240 situated in the area 100a. This oxide layer 250' makes the current-voltage characteristic of each OxRAM memory point non-linear. In an embodiment, the conditions of the oxidation treatment are selected such that only part of the conductive patterns 220' is oxidised to form the insulating layer 250', to be specific their upper part. For example, the oxidation treatment may be an annealing carried out under an atmosphere containing oxygen (O$_2$), at a temperature comprised between 350° C. and 400° C. for a duration comprised between 350 s and 1500 s. Thus, the portion of patterns 220' left intact by the oxidation treatment, i.e. their lower part, can play the role of bottom electrode in the OxRAM memory point. When the patterns 220' of titanium are entirely oxidised, the bottom electrode of the OxRAM memory points may be constituted of the conductive pads 240.

On the other hand, a layer 260 made of ruthenium oxide (RuO) is formed on the upper face of the pads 240 of the area 100b. Since ruthenium oxide is a conductor of electricity, an electric current can flow without discontinuity from the base of the pads 240 (in contact with the conductive vias 102 of the substrate 100) up to the tops of the pads on which are going to be deposited the memory elements of MRAM or PCRAM type. Conversely, in the area 100a intended for the OxRAM memory points, electrical continuity is not necessary. The bottom electrode of a selector-less OxRAM memory point can make the bistable oxide transit from one state to the other (known as "breakdown" of the bistable oxide) through the insulating layer 250'.

Thus, the protective layer 210 protects the upper face of the conductive pads 240 of the area 100b in the sense where this upper face remains electrically conducting after the oxidation treatment. Rather than a layer made of ruthenium of which the oxide is conductive, it is possible to use a protective layer made of a conductive material and insensitive to the oxidation treatment, for example a noble metal (Au, Ag, Pt, etc.).

Figure 2E:
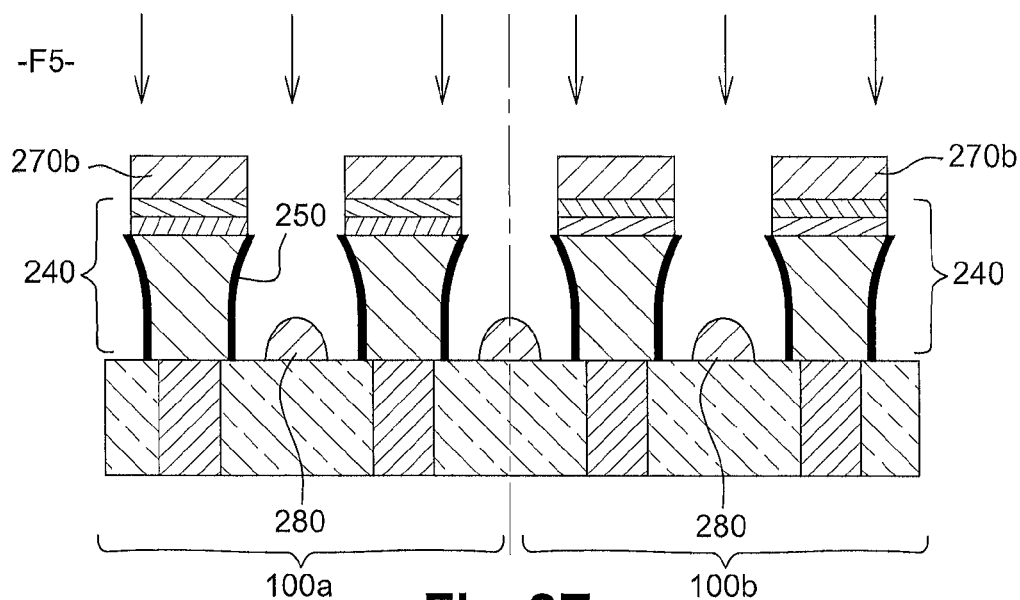

At step F5 represented by FIG. 2E, memory elements 270b of MRAM or PCRAM type are formed by physical vapor deposition (PVD) at the tops of the pillars 240 of the area 100b. In an embodiment, these same elements 270b are formed simultaneously at the tops of the pillars 240 of the area 100a, as illustrated in FIG. 2E. Each memory element 270b is thus supported by a pillar 240 of the area 100a or the area 100b.

Sputtering is beneficially used at the deposition step F5. This technique has a certain directivity making it possible to direct the deposition of conductive resistive material from the memory elements 270b towards the pillars 240, especially at their top. Nevertheless, resistive material is also deposited at the bottom of the trenches situated between the pillars 240, or even a part of the sides of the pillars depending on the incidence of the deposition and on the angular dispersion of the flux of atoms from the sputtered target, then forming residual deposits 280. In normal incidence with respect to the surface of the substrate (case represented in FIG. 2E), these residual deposits 280 are localised around the centre of the trenches. The more overhanging the sides of the pillars 240, the less the deposits 280 spread out near to the base of the sides. In oblique incidence (case not represented), the deposits 280 may be situated on a single and same side of the pillars 240.

The formation of setback sides thus prevents the simultaneous deposition of resistive material on two sides facing each other and belonging to different pillars, which avoids a short-circuit between these two pillars (even in the absence of the insulating layer 250 on the sides). In an embodiment, the sputtering is collimated in order to increase the directivity of the deposition and thus reduce the extent of the residual deposits 280 at the bottom of the trenches. The residual depositions 280 may be left as such. Thanks to the electrical discontinuity on the sides of the pillars 240, they do not perturb in a significant manner the operation of the hybrid device. In particular, they do not create inter-pad short-circuits.

The formation of the elements 270b at the tops of the pillars 240 may comprise the deposition of one or more resistive materials, depending on the envisaged memory technology. For example, to manufacture a MRAM magnetic tunnel junction, a reference layer (e.g. an alloy based on Co, Fe and B), a tunnel barrier layer (e.g. MgO) and a storage layer (e.g. an alloy based on Co, Fe and B, with concentrations identical or different to those of the reference layer) are successively deposited. The reference layer and the storage layer are (ferro-)magnetic, whereas the tunnel barrier layer is non-magnetic. The storage layer may be situated above or below the tunnel barrier, the reference layer being situated on the other side of the tunnel barrier with respect to the storage layer. For a PCRAM, the storage layer is formed of a phase change material, for example an alloy between the elements germanium, antimony and tellurium. These materials are electricity conductors. The different layers of the elements 270b may be deposited by different techniques and along different incidences.

Figure 2F:
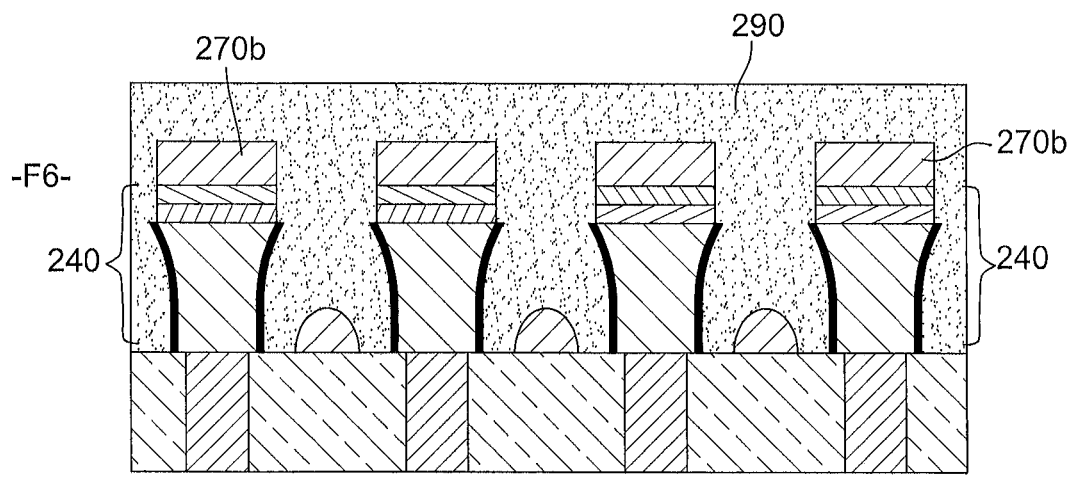

Step F6 of FIG. 2F consists in filling with a dielectric material 290 the space between the pillars 240, until covering entirely their storage element 270b.

Various techniques of the microelectronics industry enable to cover with dielectric material (generally an oxide) structures with high form factor (STI, FinFET, "Damascene" gate transistor type, etc.) and/or with overhanging sides. The gas phase deposition of liquid dielectric films may especially be cited. Liquid dielectrics are similar to a gel having the flow characteristics of a liquid. By exploiting this technique, it is easy to fill the structures with form factors greater than 10, even going up to 30. The liquid dielectric material may be selected from $Si_3N_4$, $SiO_2$, $SiO_xC_yH_x$, $SiO_xH_y$ and $SiO_{x-}N_yH_x$. These materials are selected for their electrical resistivity (beneficially $\rho > 0.1$ Ω·cm) in order that leakage currents between memory points are minimised. The benefit of this technique compared to other gas phase deposition techniques is the absence of hollows or cavities in the layer of dielectric material 290.

An alternative to gas phase methods is deposition by centrifugation. In this case, a sol-gel precursor is diluted in a solvent and deposited in liquid form on the rotating substrate. Under the effect of centrifugal force, the liquid spreads out uniformly on the surface of the substrate. The precursors polymerise and the solvent evaporates to form a dielectric material called "Spin On Glass" (SOG). The thickness of the layer deposited is controlled by the viscosity of the material and the speed of rotation of the substrate. The materials thereby formed may be silicas or silicones of poly-methylsiloxane, poly-methylsilsesquioxane, poly-oxycarbosilane, poly-dimethylsiloxane type. They may also be polymers, such as planarizing resins, for example that sold by the firm "Honeywell" under the denomination "ACCU-FLO".

Figure 2G:
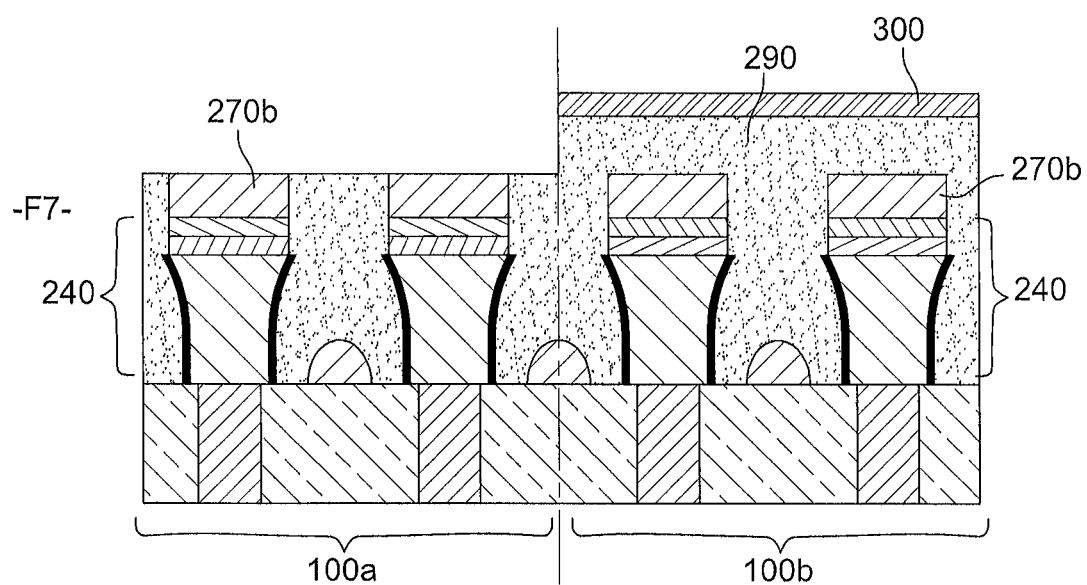
Figure 2H:
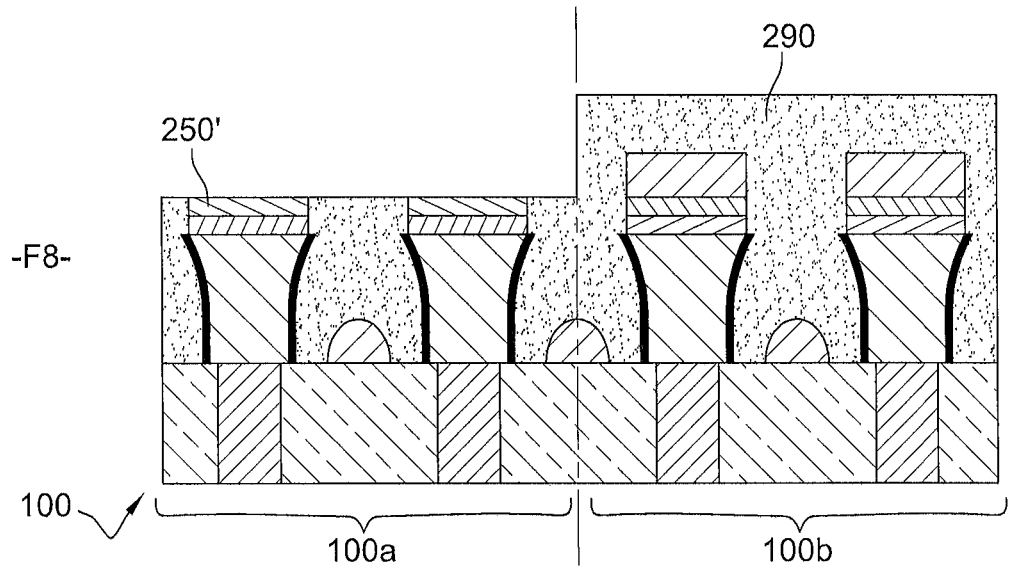

At step F7 of FIG. 2G, a portion of the layer made of dielectric material 290 is etched until the memory elements 270b situated in the area 100a are uncovered. This etching is, in an embodiment, carried out by means of a reactive plasma. A hard mask 300 is formed beforehand on the dielectric material 290 in the area 100b, to protect it from the etching.

Then, in F8, the memory elements 270b of the area 100a are eliminated, for example by reactive plasma etching. Beneficially, the plasma etches simultaneously the dielectric material 290 in the area 100a and the etching ends when the insulating layer 250' is reached. In this case, since the plasma is not selective compared to the dielectric material 290, the mask 300 of the preceding step F7 may again be used to protect the area 100b, then this is also removed after etching.

At step F9 (FIG. 2I), an oxide layer 270, in an embodiment a transition metal oxide selected from hafnium oxides ($HfO_x$) and tantalum oxides ($TaO_x$), is deposited at the tops of the pads 240 of the area 100a. Each pad 240 supports a portion of this layer 270, which forms a memory element 270a of OxRAM type, and more particularly of selector-less OxRAM type in the presence of the insulating layer 250'. The oxide layer 270 may also be deposited on the dielectric material 290 situated between the pads 240 of the area 100a and thus connect the different pads 240. Yet, since it is electrically insulating, the oxide layer 270 does not cause a short-circuit between the different memory points of the OxRAM array. The surface of the substrate is in an embodiment flat in the area 100a, thanks to the fact that the etching plasma of step F8 is anisotropic.

Figure 2I:
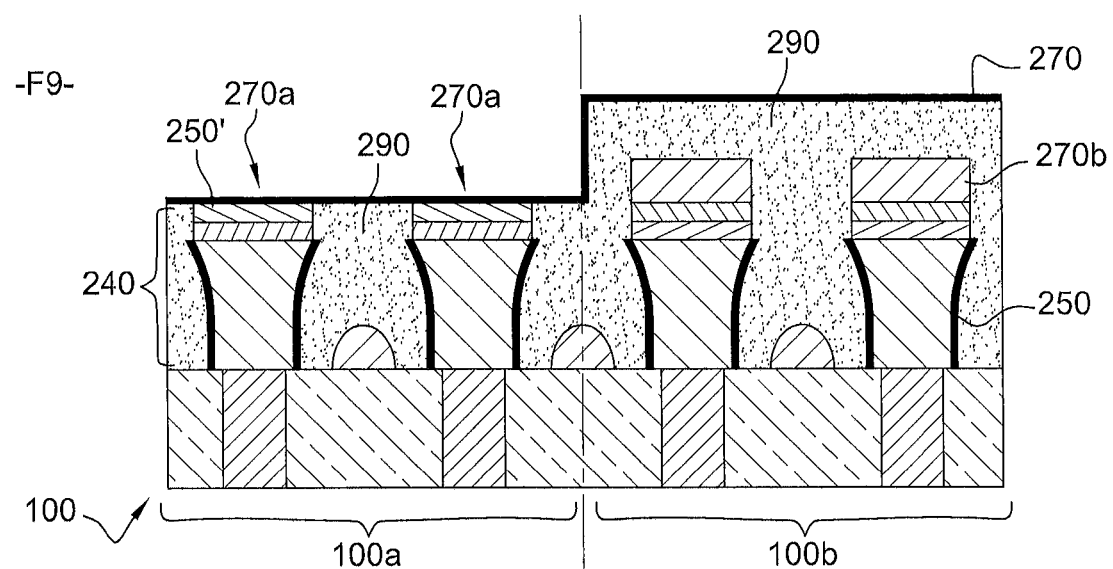

As illustrated in FIG. 2I, the oxide layer 270 also covers the portion of layer of dielectric material 290 situated in the area 100b and in which the memory elements 270b (MRAM or PCRAM) are buried. Thus, the oxide layer 270 does not perturb the operation of the memory elements 270b. In an embodiment, the oxide layer 270 is deposited on the entire surface of the substrate by a conformal deposition technique, such as PECVD (Plasma-Enhanced Chemical Vapor Deposition) or ALD (Atomic Layer Deposition).

The fact of depositing, at step F5 of FIG. 2E, the MRAM (or PCRAM) elements on the two areas 100a and 100b of the substrate largely simplifies the PVD step. Furthermore, the method up to FIG. 2F may thus be identical to the method for manufacturing a single MRAM (or PCRAM) memory device.

An alternative to the steps of forming the memory elements 270a and 270b (FIGS. 2E-2I) consists in protecting with a dielectric material the area 100a of the OxRAM before the PVD of the MRAM or PCRAM memory elements 270b, so that they are only formed in the area 100b. Then, these elements 270b are covered with dielectric material, whereas the dielectric material in the area 100a is removed to release the upper face of the pads 240 situated in this area. The oxide layer 270 can then be deposited in the area 100a, and (eventually) on the dielectric material of the area 100b.

Figure 2J:
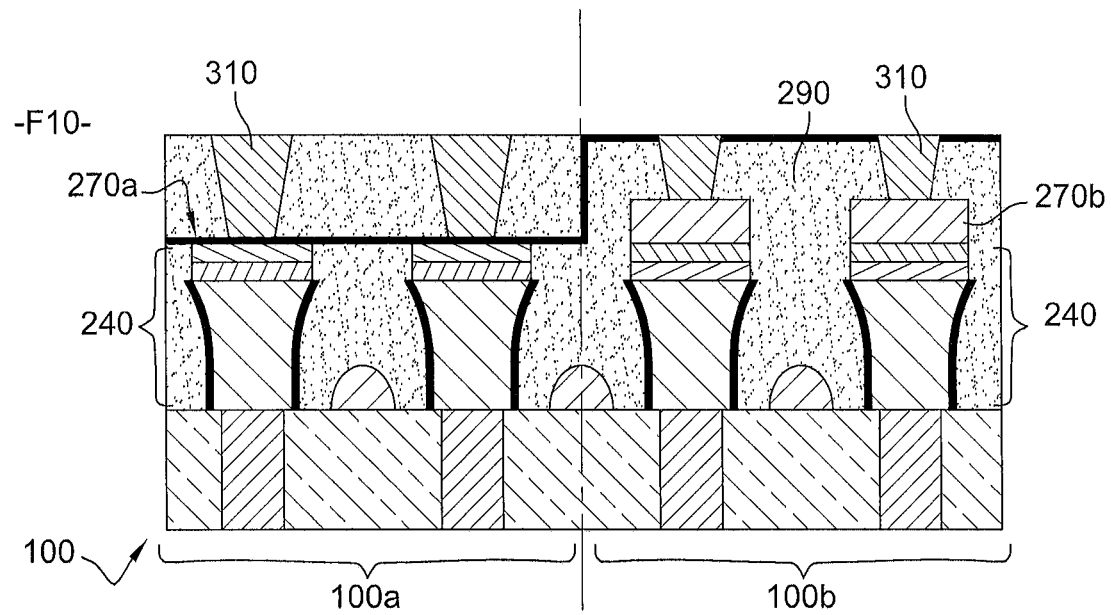

FIG. 2J shows the final step of the manufacturing method, in which electrical contacts 310 are formed at the tops of the memory elements 270a and 270b. The contacts 310 are, in an embodiment, obtained by a method of "Damascene" type. This "Damascene" method conventionally comprises the deposition of dielectric material (here limited to the first area 100a to obtain a flat surface over the whole substrate), the etching of cavities in the dielectric material until the memory elements 270a and 270b are reached, then the filling of the cavities by a conductive material, generally a metal (Al, Cu, TiN/Ti, etc.).

Thanks to this manufacturing method, it is henceforth possible to manufacture a compact and efficient hybrid memory device, comprising a plurality of (selector-less) OxRAM memory points in the area 100a of the substrate 100 and a plurality of MRAM or PCRAM memory points in the adjacent area 100b. Each memory point is formed of a vertical nanostructure having as base a conductive pad 240. The OxRAM memory points have an insulating storage layer 270a, whereas the MRAM or PCRAM memory points each include a memory element 270b provided with at least one conductive storage layer.

This method is particularly simple to implement, because several steps are common to the first and second areas 100a-100b of the substrate, especially the steps of formation of the conductive pads 240 (in the embodiment of FIGS. 2A to 2J) and the step F4 of oxidation of the conductive pads. Indeed, this latter step forms simultaneously the rectification layer in the area 100a and insulating sides in the area 100b (and potentially in the area 100a, even though such sides are unnecessary there).

Numerous variants and modifications of the method for manufacturing a hybrid memory device will become clear to those skilled in the art. In particular, the order in which the two types of memory elements are formed is capable of varying. Moreover, the manufacturing method, described here in relation with FIGS. 2A to 2J, may not employ the second conductive layer 220 and/or the protective layer 210 made of ruthenium or noble metal.

To protect the upper face of the pads 240 in the MRAM/PCRAM area 100b, it is especially possible to use the etching mask 230 (used at step F3 of etching of the pads 240; FIG. 2C) during the step of oxidation F4 and to only remove it after. The etching mask 230 (or more exactly its patterns 231 situated in the area 100b) then constitutes the protective layer. Otherwise it is possible to deposit at the tops of the pads 240 of the area 100b another so-called sacrificial protective material, such as a silicon nitride (SiN, $Si_3N_4$, SiOCN, SiNH) or a silicon oxide ($SiO_2$). The protective material is removed after the step of oxidation F4, to make the upper face of the pillars 240 once again conductive. In these two cases, the conductive pads 240 of the area 100b are uniquely constituted of the material of the conductive layer 200.

Similarly, when the second conductive layer 220 is unused, the conductive pads 240 of the area 100b are uniquely constituted of patterns 200' from the first conductive layer 200. It is thus the upper portion of these patterns 200' that will be oxidised during step F4 and which will play the role of rectification layer in the OxRAM, whereas the lower portion of the patterns 200' will act as an electrode.

Figure 3A:
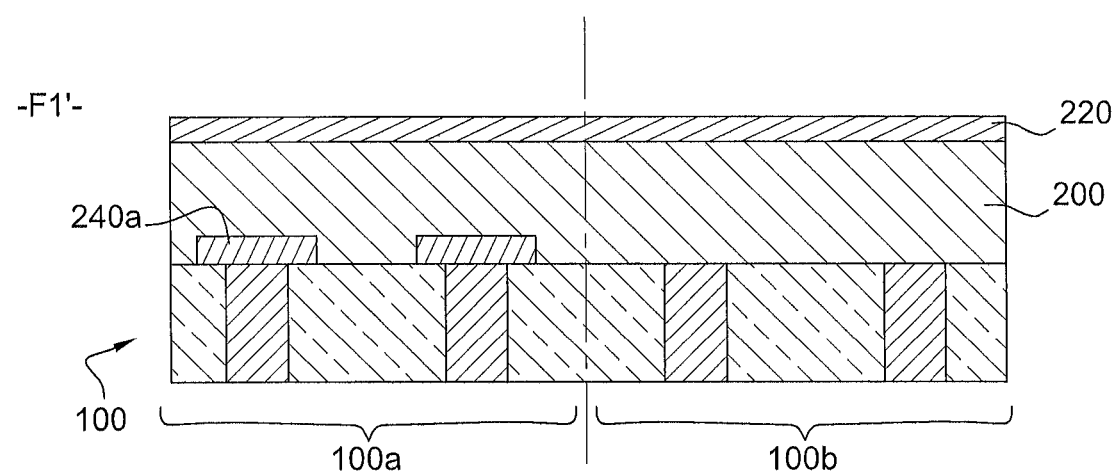
FIGS. 3A to 3C represent the steps F1' to F3' of a method for manufacturing a hybrid memory device, according to an alternative embodiment of the invention.
Figure 3B:
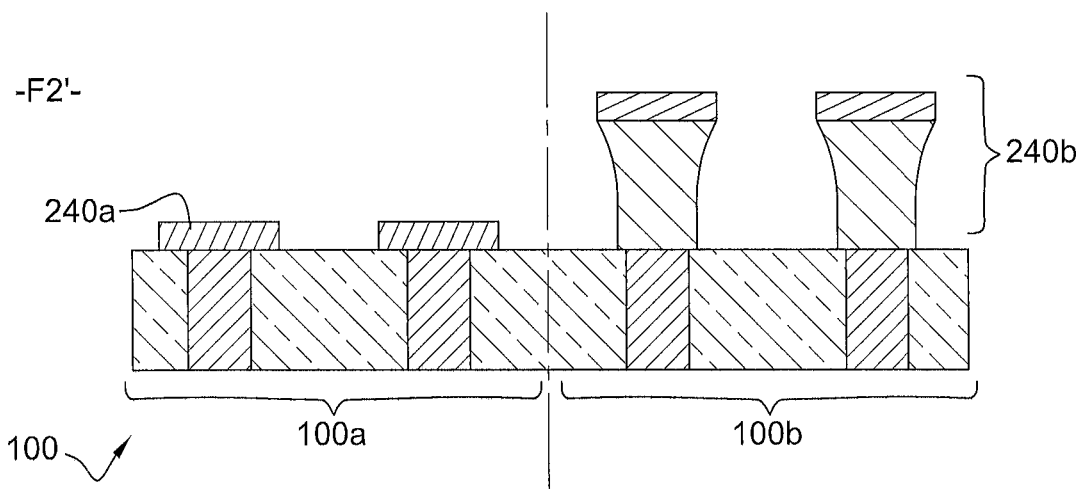
Figure 3C:
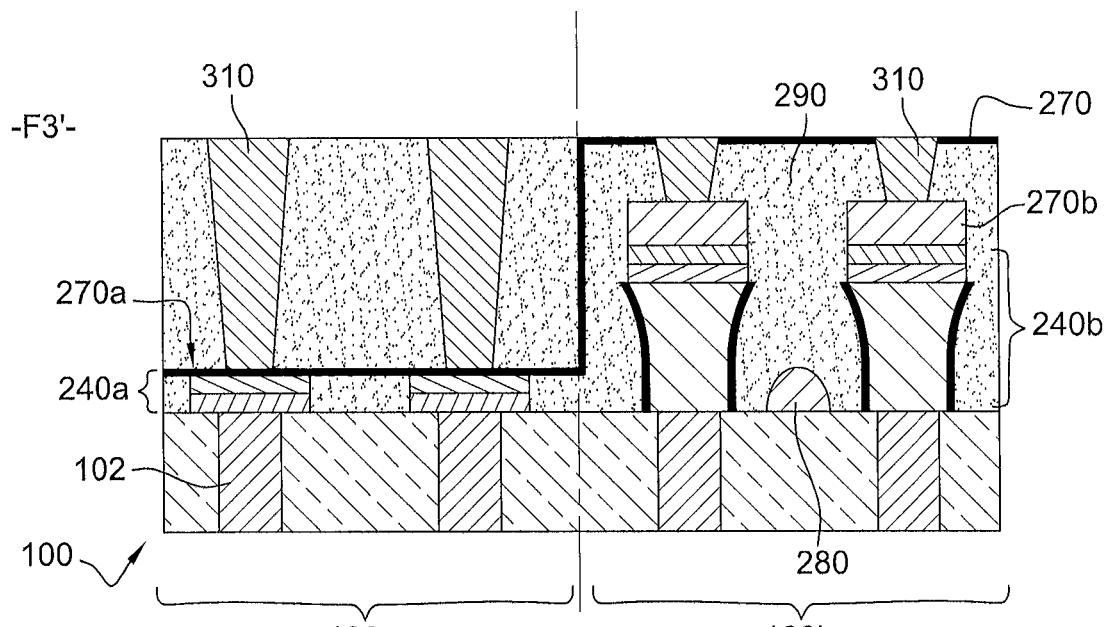

Finally, FIGS. 3A to 3C represent an alternative variant of the manufacturing method in which the conductive pads of the OxRAM area 100a are formed before the conductive pads of the MRAM or PCRAM area 100b.

At step F1' (FIG. 3A), conductive pads 240a are formed in the first area 100a of the substrate 100, for example by photolithography then etching. These pads 240a are, in an embodiment, formed of the material of the second conductive layer 220 described above, that is to say a material having rectification properties once oxidised, for example titanium. The first conductive layer 200 is then deposited on the area 100b, and in an embodiment over the entire surface of the substrate 100, then beneficially covered by the protective layer 220.

In F2' (FIG. 3B), the conductive layer 200 and the protective layer 220 are etched to form the conductive pillars 240b in the area 100b and entirely removed in the area 100a, so as to release the conductive pads 240a situated on the surface of the substrate 100. The pads 240a may be of compact shape compared to the pillars 240b and have vertical sides. This is not problematic since it is unnecessary to discretise the active layer (270) of the OxRAM memory points.

Thus, in this variant, the conductive pads 240a of the area 100a may be of shape and nature different to the conductive pads 240b of the area 100b. Moreover, they constitute the bottom electrode of the OxRAM memory points.

The remainder of the manufacturing method, represented by step F3' of FIG. 3C, is carried out as described above in relation with FIGS. 2D to 2J (steps F4 to F10). It will be noted that, due to their lower height, the pads 240a of the area 100a need electrical contacts 310 deeper than those of the pillars 240b situated in the adjacent area 100b, and that the residual deposits 280 of MRAM or PCRAM resistive material may be easily eliminated in the OxRAM area 100a (by entirely removing the dielectric material 290 in the area 100a, at step F7 of FIG. 2G).

Apart from the elements evoked above, the hybrid memory device illustrated in FIG. 3C is identical to that of FIG. 2J. Elements that reappear bear the same reference signs.

The invention claimed is:

1. A method for manufacturing a hybrid non-volatile memory device comprising:
   forming a first group of electrically conductive pads spaced apart from each other in a first area of a substrate;
   depositing a first electrically conductive layer on a second area of the substrate;
   etching the first conductive layer, so as to obtain a second group of electrically conductive pads spaced apart from each other in the second area, the etching conditions being chosen such that the conductive pads of the second area have a section at their base smaller than at their top;
   protecting an upper face of the conductive pads of the second area;
   subjecting the substrate to an oxidation treatment, resulting in a layer made of insulating material covering an upper face of the conductive pads of the first area and sides of the conductive pads of the second area;
   depositing an oxide layer at the tops of the conductive pads of the first area, resulting in memory elements of a first type supported by the conductive pads of the first area; and
   forming by physical vapor deposition memory elements of a second type at the tops of the conductive pads of the second area, such that each memory element of the second type is supported by one of the conductive pads of the second area.

2. The method according to claim 1, wherein the conductive pads of the first area are formed at the same time as the conductive pads of the second area, by etching the first conductive layer deposited beforehand on the first and second areas.

3. The method according to claim 2, comprising depositing a second conductive layer on the first conductive layer in the first area, the first and second conductive layers being etched simultaneously to form the conductive pads of the first area.

4. The method according to claim 3, wherein the second conductive layer is made of titanium.

5. The method according to claim 1, wherein the conductive pads of the first area are formed before depositing the first conductive layer on the second area.

6. The method according to claim 1, wherein the memory elements of the second type are formed simultaneously by physical vapor deposition at the tops of the conductive pads of the first area and at the tops of the conductive pads of the second area, the method further comprising, before depositing the oxide layer:
   covering with a dielectric material the conductive pads of the first and second areas;
   etching the dielectric material in the first area until the memory elements of the second type situated in the first area are revealed; and
   eliminating the memory elements of the second type in the first area.

7. The method according to claim 6, wherein the oxide layer is deposited on the first and second areas by PECVD or ALD.

8. The method according to claim 1, wherein the upper face of the conductive pads of the second area is protected by forming in the second area a protective layer on the first conductive layer, before etching the first conductive layer.

9. The method according to claim 8, wherein the protective layer occupies all the second area and is etched at the same time as the first conductive layer to form the conductive pads of the second area.

10. The method according to claim 9, wherein the protective layer is made of ruthenium.

11. The method according to claim 8, wherein the protective layer is constituted of an etching mask used to etch the first conductive layer.

12. The method according to claim 11, wherein the protective layer is removed after the oxidation treatment.

13. The method according to claim 1, wherein the first conductive layer is etched by reactive plasma etching.

14. A hybrid non-volatile memory device comprising: a substrate comprising first and second areas; a plurality of electrically conductive pads arranged on the substrate and spread out between the first and second areas, the pads of the second area having a section at their base smaller than at their top; an electrically insulating layer covering sides of the conductive pads of the second area and at least an upper face of the conductive pads of the first area; a first storage layer made of oxide covering the conductive pads of the first area, resulting in a plurality of memory elements of a first type in the first area; and a plurality of memory elements of a second type arranged at the tops of the conductive pads of the second area, such that each memory element of the second type is supported by one of the conductive pads of the second area, the memory elements of the second type comprising a second electrically conducting storage layer.

15. The device according to claim 14, wherein the memory elements of the first type are selector-less OxRAM memory elements and wherein the memory elements of the second type are PCRAM or MRAM memory elements.

* * * * *